United States Patent [19]

Terada et al.

[11] Patent Number: 5,216,355
[45] Date of Patent: Jun. 1, 1993

[54] ELECTRONIC VOLUME CONTROLLER

[75] Inventors: Toyohiko Terada; Yoshio Sasaki, both of Saitama, Japan

[73] Assignee: Pioneer Electronic Corporation, Tokyo, Japan

[21] Appl. No.: 874,997

[22] Filed: Apr. 24, 1992

Related U.S. Application Data

[63] Continuation of Ser. No. 690,219, Apr. 24, 1991, abandoned.

[30] Foreign Application Priority Data

Oct. 25, 1990 [JP] Japan .................................. 2-287988

[51] Int. Cl.⁵ ............................................ G05F 3/08
[52] U.S. Cl. ................................ 323/354; 333/81 R; 301/540; 323/297
[58] Field of Search .............. 323/352, 353, 354, 297, 323/81 R; 307/540

[56] References Cited

U.S. PATENT DOCUMENTS

| | | | |
|---|---|---|---|
| 3,519,930 | 7/1970 | Bradley | 324/98 |
| 4,012,688 | 3/1977 | Blackburn et al. | 323/354 |
| 4,118,700 | 10/1978 | Lenihan | 340/524 |
| 4,280,089 | 7/1981 | van de Plassche et al. | 323/354 |
| 4,549,131 | 10/1985 | Kusazaki | 323/354 |
| 4,810,949 | 3/1989 | Schiemenz | 323/354 |

FOREIGN PATENT DOCUMENTS 2912776 10/1980 Fed. Rep. of Germany ...... 323/354

Primary Examiner—Steven L. Stephan
Assistant Examiner—Ben Davidson
Attorney, Agent, or Firm—Nikaido, Marmelstein, Murray & Oram

[57] ABSTRACT

A main ladder attenuator has a series of resistors and switches for connecting corresponding resistors to an output. The controller has an auxiliary ladder attenuator connected to the main ladder attenuator in series and having a series of resistors and switches. Each of the resistors of the auxiliary ladder attenuator is provided for interpolating between the adjacent resistors of the main ladder attenuator.

4 Claims, 9 Drawing Sheets

FIG. 4

| (LSB) | 1 | 2 | 3 | 4 | 5 | 6 | |
|---|---|---|---|---|---|---|---|
| (a) | D01 | D02 | D03 | D04 | D05 | D06 | :LCH MAIN VOLUME DATA |

| | 7 | 8 | |
|---|---|---|---|
| (b) | D07 | D08 | :LCH INTERPOLATION VOLUME DATA |

| | 9 | 10 | 11 | 12 | 13 | 14 | |
|---|---|---|---|---|---|---|---|
| (c) | D11 | D12 | D13 | D14 | D15 | D16 | :RCH MAIN VOLUME DATA |

| | 15 | 16 | |
|---|---|---|---|
| (d) | D17 | D18 | :RCH INTERPOLATION VOLUME DATA |

| | 17 | 18 | 19 | 20 | |
|---|---|---|---|---|---|
| (e) | D21 | D22 | D23 | D24 | :BASS VOLUME DATA |

| | 21 | 22 | 23 | 24 | |
|---|---|---|---|---|---|
| (f) | D31 | D32 | D33 | D34 | :MIDDLE VOLUME DATA |

| | 25 | 26 | 27 | 28 | |
|---|---|---|---|---|---|
| (g) | D41 | D42 | D43 | D44 | :TREBLE VOLUME DATA |

| | 29 | 30 | 31 | 32 | |
|---|---|---|---|---|---|
| (h) | D51 | D52 | D53 | D54 | :FADER VOLUME DATA |

| | 33 | 34 | 35 | 36 | 37 | 38 (MSB) | |
|---|---|---|---|---|---|---|---|
| (i) | F/R | LD | C1 | C2 | C3 | C4 | :(1) FADER SELECT DATA<br>(2) LOUDNESS SELECT DATA<br>(3) CHIP SELECT DATA |

FIG. 5

| MAIN VOLUME | D01/D11 | D02/D12 | D03/D13 | D04/D14 | D05/D15 | D06/D16 |
|---|---|---|---|---|---|---|
| 0 dB | 0 | 0 | 0 | 0 | 0 | 0 |
| 2 dB | 1 | 0 | 0 | 0 | 0 | 0 |
| 4 dB | 0 | 1 | 0 | 0 | 0 | 0 |
| 6 dB | 1 | 1 | 0 | 0 | 0 | 0 |
| 8 dB | 0 | 0 | 1 | 0 | 0 | 0 |
| 10 dB | 1 | 0 | 1 | 0 | 0 | 0 |
| 12 dB | 0 | 1 | 1 | 0 | 0 | 0 |
| 14 dB | 1 | 1 | 1 | 0 | 0 | 0 |
| 16 dB | 0 | 0 | 0 | 1 | 0 | 0 |
| 18 dB | 1 | 0 | 0 | 1 | 0 | 0 |
| 20 dB | 0 | 1 | 0 | 1 | 0 | 0 |
| 22 dB | 1 | 1 | 0 | 1 | 0 | 0 |
| 24 dB | 0 | 0 | 1 | 1 | 0 | 0 |
| 26 dB | 1 | 0 | 1 | 1 | 0 | 0 |
| 28 dB | 0 | 1 | 1 | 1 | 0 | 0 |
| 30 dB | 1 | 1 | 1 | 1 | 0 | 0 |
| 32 dB | 0 | 0 | 0 | 0 | 1 | 0 |
| 34 dB | 1 | 0 | 0 | 0 | 1 | 0 |
| 36 dB | 0 | 1 | 0 | 0 | 1 | 0 |
| 38 dB | 1 | 1 | 0 | 0 | 1 | 0 |
| 40 dB | 0 | 0 | 1 | 0 | 1 | 0 |
| 42 dB | 1 | 0 | 1 | 0 | 1 | 0 |
| 46 dB | 0 | 1 | 1 | 0 | 1 | 1 |
| 50 dB | 1 | 1 | 1 | 0 | 1 | 1 |
| 54 dB | 0 | 0 | 0 | 1 | 1 | 1 |
| 58 dB | 1 | 0 | 0 | 1 | 1 | 1 |
| 62 dB | 0 | 1 | 0 | 1 | 1 | 1 |
| 66 dB | 1 | 1 | 0 | 1 | 1 | 1 |
| 70 dB | 0 | 0 | 1 | 1 | 1 | 1 |
| 74 dB | 1 | 0 | 1 | 1 | 1 | 1 |
| 78 dB | 0 | 1 | 1 | 1 | 1 | 1 |
| ∞ dB | 1 | 1 | 1 | 1 | 1 | 1 |

FIG. 6

| INTERPOLATION VOLUME | D07 D17 | D08 D18 |
|---|---|---|
| 0 dB | 0 | 0 |
| 1 dB | 0 | 1 |
| 2 dB | 1 | 0 |
| 3 dB | 1 | 1 |

ELECTRONIC VOLUME CONTROLLER

This application is a continuation of application Ser. No. 690,219 filed Apr. 24, 1991 now abandoned.

BACKGROUND OF THE INVENTION

The present invention relates to an electronic volume controller, and more particularly to a circuit for electronically controlling volume of an acoustic system.

The volume controller has a ladder attenuator comprising a plurality of resistors connected in series, and a plurality of switches corresponding to the resistors. The resistors are connected to an output one by one with the closing of corresponding switches, thereby decreasing the volume of a reproduced sound. The number of the resistors is determined in accordance with maximum attenuation and the amount of attenuation at each step. Namely, in order to attenuate the input signal thereto from 80 dB to 0 dB by 1 dB per step, eighty resistors and eighty one switches are required.

FIG. 10 shows an example of a conventional electronic volume controller 1. The input terminal of the volume controller is connected to a ladder attenuator 2 through a buffer amplifier 6. The ladder attenuator 2 comprises a series of resistors 2a each of which is connected to a corresponding analog switch 3 so that the resistance of the ladder attenuator 2 is changed from 0 dB to 70 dB by 10 dB per step.

The volume controller 1 further has a ladder attenuator 4 which is parallely connected to the ladder attenuator 2 through a buffer amplifier 8. Each resistor 4a of the ladder attenuator 4 is connected to a corresponding analog switch 5 to attenuate the volume from 0 dB to 9 dB by 1 dB per step, thereby finely changing the volume.

A loudness circuit 7 comprising resistors Ra and Rb and capacitors Ca and Cb is connected to both ends of the ladder attenuator 2. A loudness tap of the loudness circuit 7 is connected to one of the analog switches 3 which corresponds to the switch for −20 dB.

The switches 5 are selectively closed from 0 dB, thereby increasing the attenuation from 0 to −9 dB.

For example, when obtaining the attenuation of −22 dB, switches 3 corresponding to −20 dB are closed, and the switches 5 corresponding to −2 dB are closed.

The ladder attenuator 2 connected to the loudness circuit 7 is constructed to increase the attenuation by 10 dB. Therefore, when only the ladder attenuator 2 is operated, the volume is largely increased at each step, which gives unpleasant feeling to a listener.

SUMMARY OF THE INVENTION

The object of the present invention is to provide an electronic volume controller where the resistance at each step is reduced so as to smoothly change the volume.

According to the present invention, there is provided an electronic volume controller comprising, a main ladder attenuator having a series of resistors and switches each of which is provided for connecting a corresponding resistor to an output, and an auxiliary ladder attenuator connected to the main ladder attenuator in series and having a series of resistors and switches each of which is provided for connecting a corresponding resistor to the output, and each of the resistors being provided for interpolating between the adjacent resistors of the main ladder attenuator.

In an aspect of the invention, the resistors of the main ladder attenuator are divided into a first group having a predetermined small resistance interval between adjacent resistors, and a second group having a predetermined resistance interval between adjacent resistors which is larger than the small resistance interval.

These and other objects and features of this invention will become understood from the following description with reference to the accompanying drawings.

BRIEF DESCRIPTION OF DRAWINGS

FIG. 4 is a diagram showing the allocation of the data allocated in the signal shown in FIG. 3;

FIG. 5 is a table showing bit allocation of main volume;

FIG. 6 is a table showing bit allocation of interpolation volume;

DETAILED DESCRIPTION OF THE PREFERRED EMBODIMENT

Figure 1:
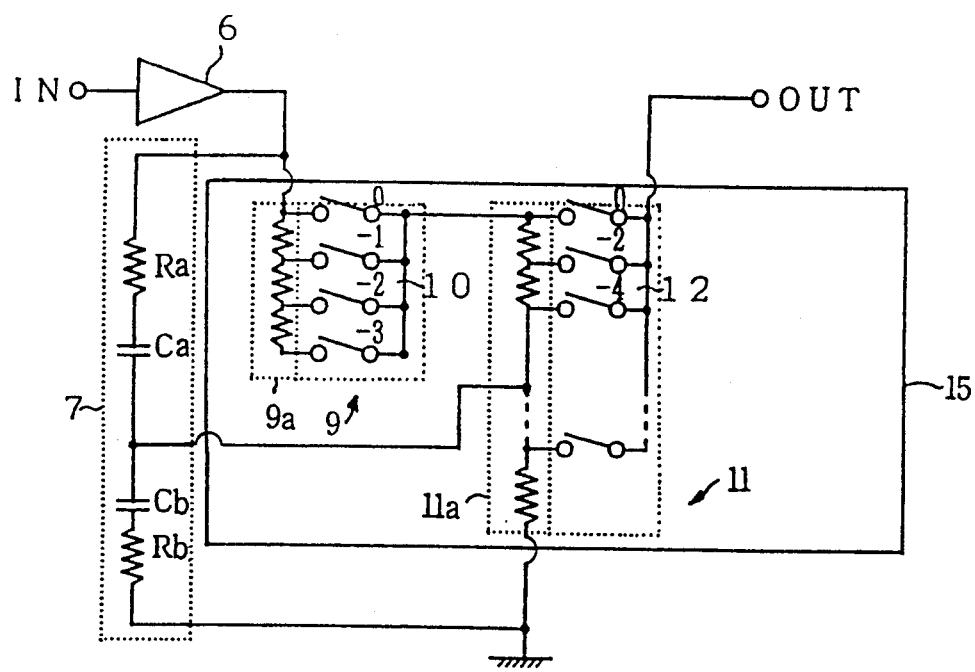
FIG. 1 is a diagram showing an electronic volume controller according to the present invention.
Figure 10:
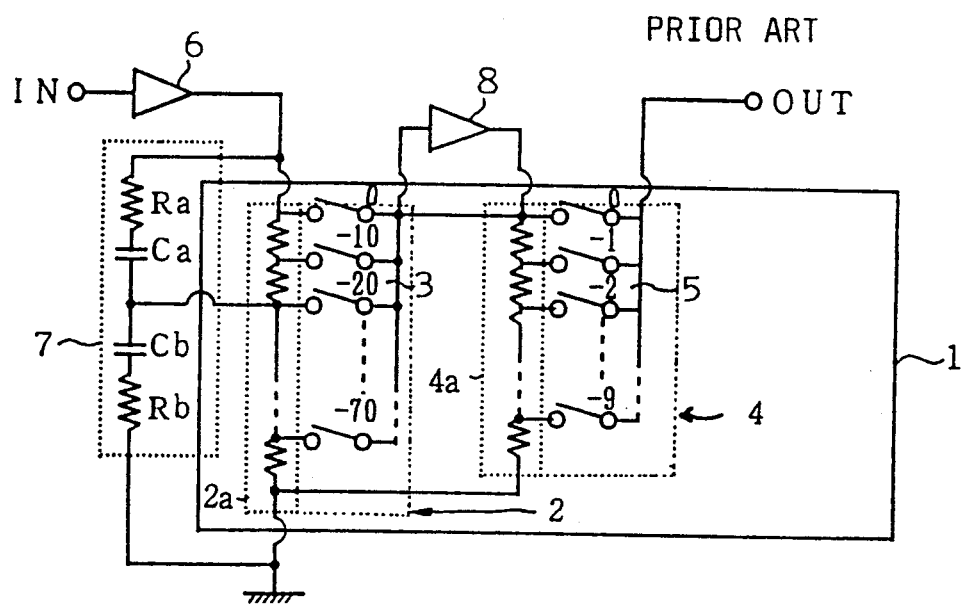
FIG. 10 is a diagram showing a conventional electronic volume controller.

Referring to FIG. 1, an electronic volume controller 15 of the present invention as integrated circuit is shown. The same numerals as those in FIG. 10 designate the same parts in FIG. 1.

An input terminal of the volume controller 15 is connected to an auxiliary ladder attenuator 9 comprising a series of resistors 9a and a set of switches 10. As shown FIG. 2, the series of resistors 9a comprises resistors R01 to R03 and the set of switches 10 comprises analog switches S00 to S03 for attenuating the input signal from 0 dB to 3 dB by 1 dB per step in accordance with the closing of one of the switches S00 to S03.

Figure 2:
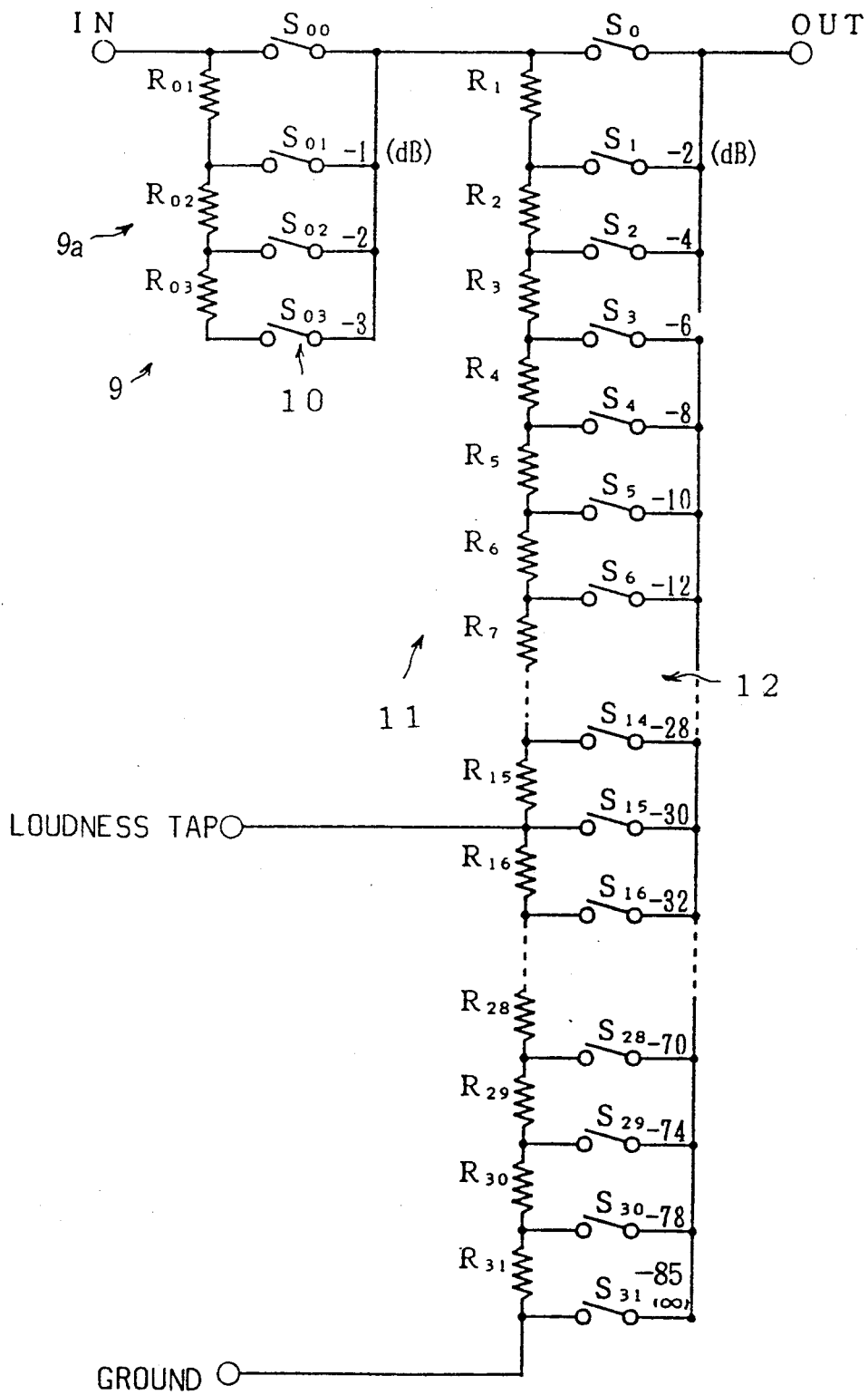
FIG. 2 is a circuit showing a part of the circuit shown in FIG. 1.

The ladder attenuator 9 is connected in series to a main ladder attenuator 11 comprising a series of resistors 11a and a set of switches 12. As shown in FIG. 2, the resistors 11a comprises resistors R1 to R31 and the switches 12 comprise analog switches S0 to S31. The resistors R1 to R22 are adapted to attenuate the input signal from 0 dB to 42 dB by 2 dB per step and the resistors R23 to R31 are adapted to attenuate the signal from 42 dB to ∞dB by 4 dB per step.

The loudness circuit 7 comprising the resistors Ra and Rb and capacitors Ca and Cb is connected between the input of the auxiliary ladder attenuator 9 and the ground as shown in FIG. 1. A loudness tap of the loudness circuit 7 is connected to a point corresponding to −30 dB between the resistors R15 and R16 of the main ladder attenuator 11

The main ladder attenuator 11 is provided for providing a main volume adjustment, and the auxiliary ladder attenuator 9 is provided for interpolating the main volume.

Figure 3:
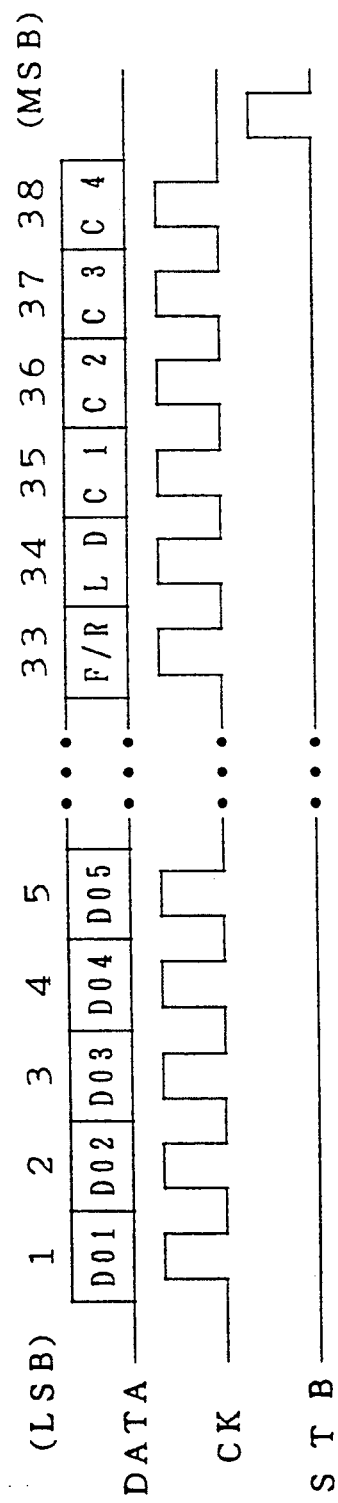
FIG. 3 is a diagram showing signals for data of the volume controller.

The analog switches S00 to S03 and S0 to S31 of the ladder attenuators 9 and 11 are operated by signals from a control unit (not shown) in dependency on data for controlling the volume. The data are provided by thirty eight bits and serially transferred through a data terminal (DATA), controlled by signals from clock terminal (CK) and strobe terminal (STB) as shown in FIG. 3.

The data are allocated as shown in FIGS. 4a to 4i. Lch (left channel) main volume data and Lch interpolation volume data are allocated in bits 1 to 6, and bits 7 and 8, respectively (FIGS. 4a and 4b). Rch (right channel) main volume data and Rch interpolation volume data are allocated in bits 9 to 14 and bits 15 and 16, respectively (FIGS. 4c and 4d). Bass volume data and middle volume data are allocated in bits 17 to 20 and bits 21 to 24, respectively (FIGS. 4e and 4f). Bits 33 to 38 are provided for fader select data, loudness select data and IC chip select data (FIG. 4i).

FIGS. 5 and 6 show bit allocations for main volume and interpolation volume respectively.

Figure 8:
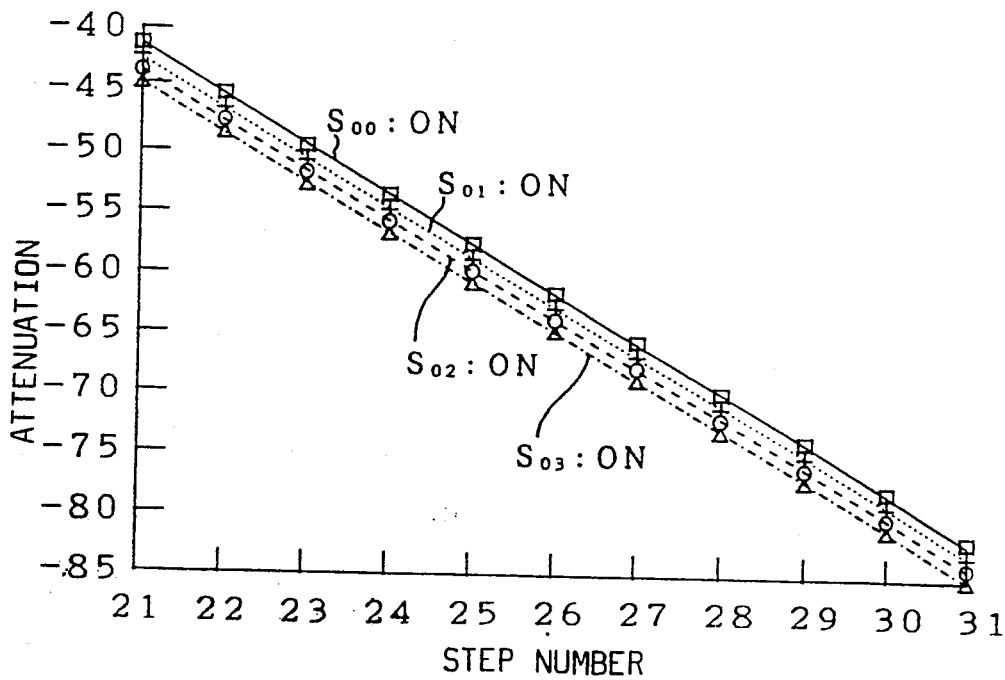
FIG. 8 is a graph showing attenuating characteristics in steps 21 to 31 of the electronic volume controller.
Figure 9:
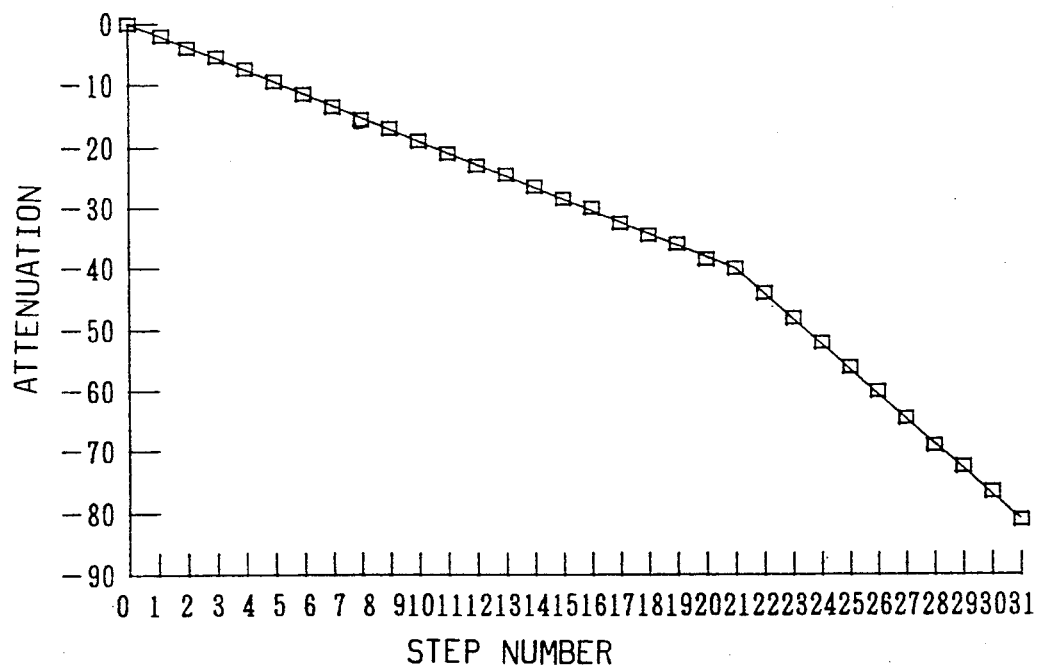
FIG. 9 is a graph showing attenuating characteristics in steps 0 to 31 of the electronic volume controller.

The operation of the present invention is described hereinafter with reference to FIGS. 7 to 9.

In order to attenuated the input signal, necessary analog switches selected from switch S1 to switch S31 of the switch set 12 are closed. If selected volume obtained by the selected switches is smaller than the necessary volume, necessary analog switches S00 to S03 of the interpolation volume ladder attenuator 9 are closed. Hence the input signal is gradually attenuated through steps 0 to 31 as shown in FIG. 9.

Figure 7:
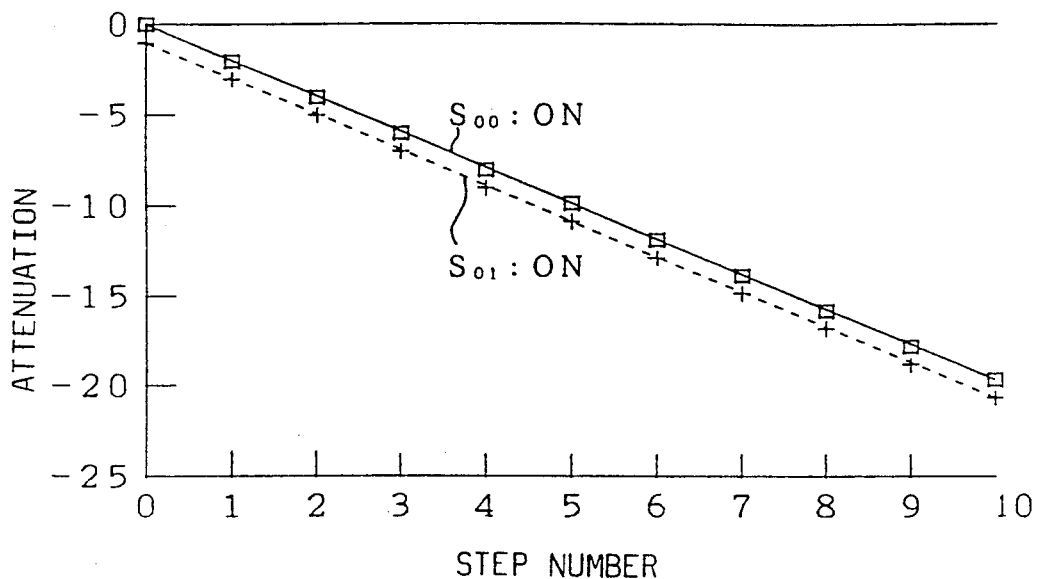
FIG. 7 is a graph showing attenuating characteristics in steps 0 to 11 of the electronic volume controller of the present invention.

FIG. 7 shows the attenuating characteristics through the steps 0 to 10 when the analog switch S00 is closed, when the switch S01 is selectively closed, and switches S1 to S10 are serially and additionally closed. FIG. 8 shows the attenuating characteristics through the steps 21 to 31 when the switches S01 to S03 of the ladder attenuator 9 are selectively closed, and when switches S21 to S31 are additionally closed. Thus the input signal can be gradually attenuated from 1 dB to 85 dB.

For example, in order to obtain the attenuation of −31 dB, the analog switch S01 corresponding to −1 dB of the auxiliary ladder attenuator 9 is closed. The main ladder attenuator 11 is operated so as to serially and additionally close the switch S1 to the switch S15 which corresponds to −30 dB. Thus the input signal is gradually attenuated.

In accordance with the present invention, the attenuation at each step of the main ladder attenuator for the main volume is small, so that the input signal is gradually attenuated. Since the main ladder attenuator and the auxiliary ladder attenuator are connected in series and the attenuation of each step of the attenuators is small, the attenuators do not interfere with each other. Accordingly, a buffer amplifier is not needed between both the ladder attenuators.

While the presently preferred embodiment of the present invention has been shown and described, it is to be understood that this disclosure is for the purpose of illustration and that various changes and modifications may be made without departing from the scope of the invention as set forth in the appended claims.

What is claimed is:

1. An electronic volume controller for a loudness circuit having a loudness tap, said electronic volume controller comprising:

a main ladder attenuator having a plurality of resistors connected in series and a plurality of switches, each switch is provided for connecting a corresponding resistor to an output terminal, the resistors of the main ladder attenuator are divided into a first group having a predetermined small resistance interval between adjacent resistors, and a second group having a predetermined large resistance interval between adjacent resistors which is larger than said small resistance interval; and an auxiliary ladder attenuator connected directly to the main ladder attenuator in series without a buffer amplifier therebetween and having a plurality of resistors connected in series and a plurality of switches, each switch is provided for connecting a corresponding resistor to the main ladder attenuator, and each of the resistors of the auxiliary ladder attenuator being provided for interpolating the resistance interval between the adjacent resistors of the main ladder attenuator by decibel, wherein said loudness circuit being connected across the main ladder attenuator and said loudness tap of said loudness circuit being connected to an intermediate point of the first group of the main ladder attenuator.

2. An electronic volume controller for a loudness circuit having a loudness tap, said electronic volume controller comprising:

a main ladder attenuator having a) a series of resistors and b) switches, each of which is provided for connecting a corresponding resistor to an output terminal, the resistors of the main ladder attenuator being divided into a first group having a predetermined small resistance interval between adjacent resistors, and a second group having a predetermined large resistance interval between adjacent resistors which is larger than said small resistance interval; and an auxiliary ladder attenuator connected directly to the main ladder attenuator in series without a buffer amplifier therebetween and having c) a series of resistors and d) switches, each of which is provided for connecting a corresponding resistor to the main ladder attenuator, and each of the resistors of the auxiliary ladder attenuator being provided for interpolating the resistance interval between the adjacent resistors of the main ladder attenuator by decibel, wherein said loudness circuit being connected across said main ladder attenuator and said loudness tap of said loudness circuit being connected to an intermediate point of said first group of said main ladder attenuator.

3. The electronic volume controller according to claim 2 wherein the small resistance interval between adjacent resistors is provided to attenuate by 2 dB, and the large resistance interval is provided to attenuate by 4 dB.

4. The electronic volume controller according to claim 1 wherein the small resistance interval between adjacent resistors is provided to attenuate by 2 dB, and the large resistance interval is provided to attenuate by 4 dB.

* * * * *